United States Patent
Ikura et al.

(10) Patent No.: US 10,910,486 B2
(45) Date of Patent: Feb. 2, 2021

(54) SEMICONDUCTOR DEVICE

(71) Applicant: FUJI ELECTRIC CO., LTD., Kanagawa (JP)

(72) Inventors: Yoshihiro Ikura, Matsumoto (JP); Akio Nakagawa, Chigasaki (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 10 days.

(21) Appl. No.: 16/281,042

(22) Filed: Feb. 20, 2019

(65) Prior Publication Data

US 2019/0312134 A1 Oct. 10, 2019

(30) Foreign Application Priority Data

Apr. 4, 2018 (JP) .................................. 2018-072793

(51) Int. Cl.
*H01L 29/739* (2006.01)
*H01L 29/417* (2006.01)
*H01L 29/08* (2006.01)
*H01L 29/10* (2006.01)

(52) U.S. Cl.
CPC ...... *H01L 29/7397* (2013.01); *H01L 29/0804* (2013.01); *H01L 29/1095* (2013.01); *H01L 29/41708* (2013.01)

(58) Field of Classification Search
None
See application file for complete search history.

(56) References Cited

U.S. PATENT DOCUMENTS

| 2001/0054738 A1 | 12/2001 | Momota | |
|---|---|---|---|
| 2007/0114598 A1* | 5/2007 | Hotta | H01L 29/0634 257/330 |
| 2008/0012040 A1* | 1/2008 | Saito | H01L 29/407 257/133 |
| 2012/0146091 A1* | 6/2012 | Tanabe | H01L 29/1095 257/139 |
| 2015/0318385 A1* | 11/2015 | Kameyama | H01L 29/7397 257/140 |

FOREIGN PATENT DOCUMENTS

| JP | 2001308327 A | 11/2001 |
|---|---|---|
| JP | 2007266134 A | 10/2007 |
| JP | 2012138567 A | 7/2012 |

* cited by examiner

*Primary Examiner* — Xiaoming Liu

(57) ABSTRACT

The present invention provides a semiconductor device including (a) a drift region of a first-conductivity-type, (b) a base region of a second-conductivity-type, (c) a plurality of trench portions arranged next to each other in a predetermined arrangement direction on the upper surface of the semiconductor substrate, (d) an emitter region of a first-conductivity-type which has a higher doping concentration than the drift region, (e) an accumulation region of a first-conductivity-type which has a higher doping concentration than the drift region, and (f) a second-conductivity-type region of a second-conductivity-type which has a higher doping concentration than the base region, wherein the accumulation region and the second-conductivity-type region are provided between the base region and the drift region in a non-channel mesa portion that does not have the emitter region provided therein and that is of mesa portions between adjacent ones of the plurality of trench portions.

13 Claims, 17 Drawing Sheets

SEMICONDUCTOR DEVICE

The contents of the following Japanese patent application(s) are incorporated herein by reference:
NO. 2018-072793 filed in JP on Apr. 4, 2018.

BACKGROUND

1. Technical Field

The present invention relates to a semiconductor device.

2. Related Art

Conventionally, a semiconductor device including a floating layer is known (for example, see Patent document 1 and 2).

Patent document 1: Japanese Unexamined Patent Application, Publication No. 2007-266134
Patent document 2: Japanese Unexamined Patent Application, Publication No. 2012-138567

It is preferable to reduce the ON voltage of the semiconductor device and enhance the withstand voltage.

SUMMARY

A first aspect of the present invention provides a semiconductor device including (a) a drift region of a first-conductivity-type provided in a semiconductor substrate, (b) a base region of a second-conductivity-type provided above the drift region on an upper surface side in the semiconductor substrate, (c) a plurality of trench portions arranged next to each other in a predetermined arrangement direction on the upper surface of the semiconductor substrate, (d) an emitter region of a first-conductivity-type which has a higher doping concentration than the drift region and is provided in a mesa portion between adjacent ones of the plurality of trench portions, (d) an accumulation region of a first-conductivity-type which has a higher doping concentration than the drift region and is provided in a mesa portion between adjacent ones of the plurality of trench portions, and (e) a second-conductivity-type region of a second-conductivity-type which has a higher doping concentration than the base region and is provided in a mesa portion between adjacent ones of the plurality of trench portions, wherein the accumulation region and the second-conductivity-type region are provided between the base region and the drift region in a non-channel mesa portion that does not have the emitter region provided therein and that is of mesa portions between adjacent ones of the plurality of trench portions.

The semiconductor device may further include an emitter electrode provided above the semiconductor substrate. The non-channel mesa portion may be electrically connected to the emitter electrode.

The accumulation region may be provided above the second-conductivity-type region and below the base region.

The semiconductor device may further include a first-conductivity-type region of a first-conductivity-type which has a lower doping concentration than the accumulation region and is provided between the base region and the second-conductivity-type region in the non-channel mesa portion.

The first-conductivity-type region may include the same doping concentration as the drift region.

The first-conductivity-type region may be provided above the accumulation region.

The first-conductivity-type region may be provided below the accumulation region.

The second-conductivity-type region may be provided in contact with a lower end of the accumulation region.

The semiconductor device may include a channel mesa portion which is a mesa portion in which the emitter region is provided. The accumulation region may be provided in the channel mesa portion and the non-channel mesa portion. The accumulation region in the non-channel mesa portion may include the same depth as the accumulation region in the channel mesa portion.

The semiconductor device may include a channel mesa portion which is a mesa portion in which the emitter region is provided. The accumulation region may be provided in the channel mesa portion and the non-channel mesa portion. The accumulation region in the non-channel mesa portion may have a different depth from the accumulation region in the channel mesa portion.

The second-conductivity-type region may be provided in contact with the trench portion.

The doping concentration in the second-conductivity-type region may be higher than the doping concentration in the accumulation region in the non-channel mesa portion.

The base region in the non-channel mesa portion may be deeper than the base region in the channel mesa portion.

The semiconductor device may further include a contact region provided in the channel mesa portion and arranged next to each other in the arrangement direction with the emitter region.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention is described through the embodiments of the invention. However, the following embodiments do not limit the invention according to the claims. Also, all the combinations of the features described in the embodiment(s) are not necessarily essential for means provided by aspects of the invention.

In this specification, one side in a direction parallel to a depth direction of a semiconductor substrate is referred to as "upper", and the other side is referred to as "lower". One of two principal surfaces of a substrate, a layer or some other member is referred to as an upper surface, and the other surface is referred to as a lower surface. The "upper", "lower", "front", and "back" directions are not limited to the gravitational direction or the direction of attachment to a substrate or the like at the time of mounting of a semiconductor device.

In this specification, technical matters may be described using orthogonal coordinate axes of X axis, Y axis and Z axis. In this specification, a surface parallel to the upper surface of a semiconductor substrate is defined as an X-Y surface, and the depth direction of the semiconductor substrate is defined as the Z axis. In this specification, the view of the semiconductor substrate in the Z axis direction is referred to as a planar view.

Although a first-conductivity-type is N type and a second-conductivity-type is P type in each example embodiment shown below, the first-conductivity-type may also be P type, and the second-conductivity-type may also be N type. In this case, conductivity-types of substrates, layers, regions and the like in each example embodiment have opposite polarities, respectively.

In this specification, doping concentration refers to the concentration of impurities acting as donors or acceptors. In this specification, difference in concentrations of donors and acceptors may be regarded as doping concentration. Also, a peak value of the doping concentration distribution of the doping region may be regarded as doping concentration in the doping region.

In this specification, it is meant that the electrons or holes are majority carriers in the layers or regions specified with N or P, respectively. Also, '+' and '−' attached on 'N' and 'P' respectively mean that the higher doping concentration and the lower doping concentration than the layer or region to which it is not attached.

Figure 1:
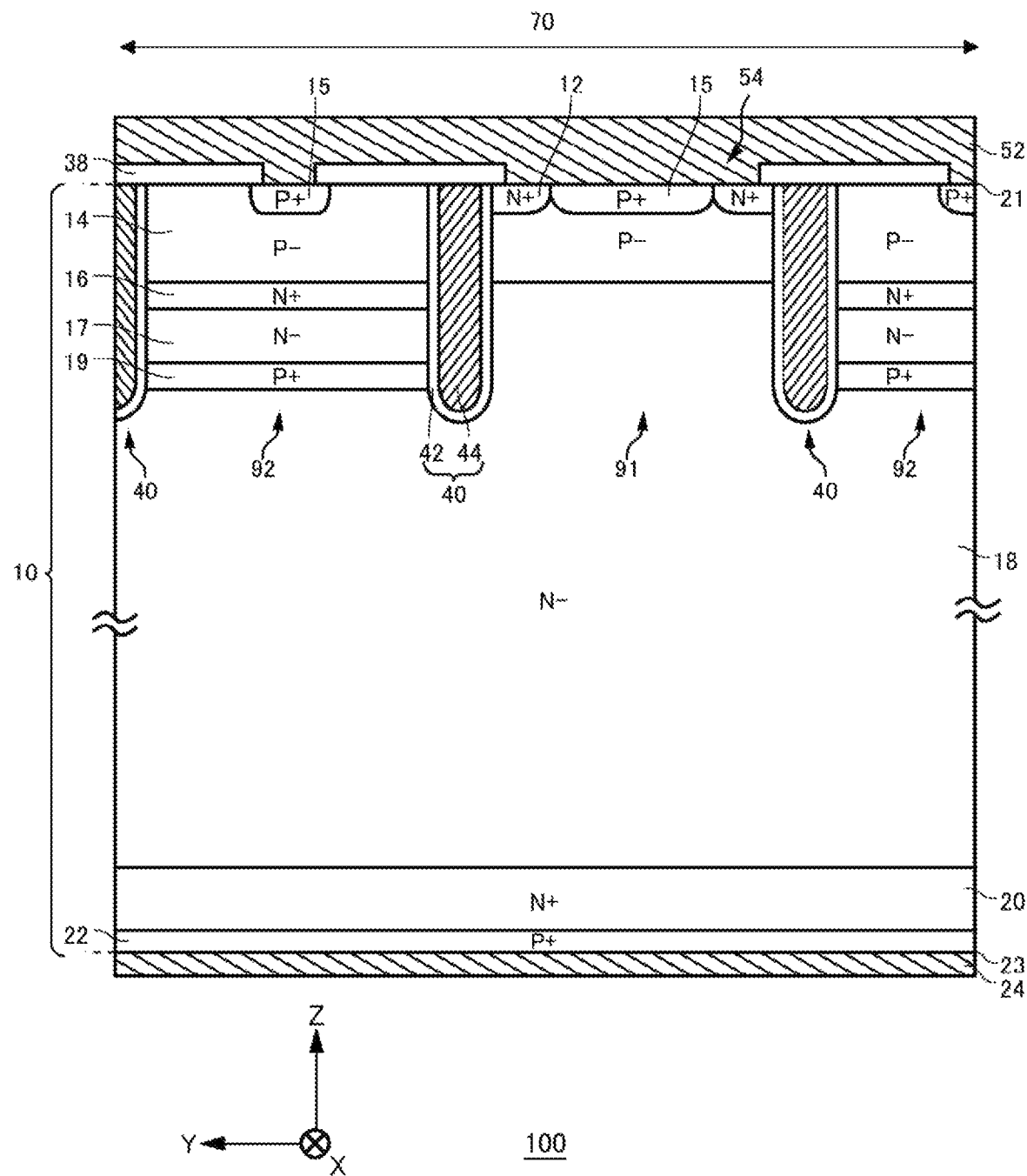
FIG. 1 shows one example of a cross sectional view of the semiconductor device 100 according to example embodiment 1.

FIG. 1 shows one example of the cross sectional view of the semiconductor device 100 according to example embodiment 1. The figure shows the Y-Z cross section of the semiconductor device 100. The Y-Z cross section is the Y-Z plane passing through the emitter region 12, the base region 14, and the contact region 15 in the transistor portion 70. The semiconductor device 100 of the present example is an IGBT (Insulated Gate Bipolar Transistor) including the transistor portion 70.

The semiconductor substrate 10 may be a silicon substrate, a silicon carbide substrate, or a nitride semiconductor substrate such as gallium nitride or the like. The semiconductor substrate 10 of the present example is a silicon substrate.

The emitter electrode 52 is provided above the upper surface 21 of the semiconductor substrate 10. The emitter electrode 52 may be formed of material including metal. For example, at least partial region of the emitter electrode 52 may be formed of aluminum or aluminum-silicon alloy. The emitter electrode 52 may include barrier metal formed of titanium, titanium compound, and the like under the region formed of aluminum and the like. The emitter electrode 52 is provided above the trench portions 40, the emitter region 12, the base region 14, and the contact region 15. The emitter electrode 52 of the present example is connected to the semiconductor substrate 10 through the contact hole 54 provided in the interlayer dielectric film 38. It is noted that a gate metal layer may be provided above the semiconductor substrate 10.

The plurality of trench portions 40 are provided on the upper surface 21 of the semiconductor substrate 10. The trench portions 40 are arranged at a predetermined interval in a predetermined arrangement direction (the Y-axis direction in the present example). The trench portions 40 of the present example extend in the extending direction (the X-axis direction in the present example) which is parallel to the upper surface 21 of the semiconductor substrate 10 and is perpendicular to the arrangement direction. The trench portions 40 of the present example are electrically connected to the gate metal layer. In regions where at least any one of the emitter region 12, the base region 14, the contact region 15, and the accumulation region 16 is provided, the trench portions 40 passes through these regions. The configuration that the trench portion 40 passes through the doping region is not limited to the one manufactured in the order of forming the doping region and then forming the trench portion 40. A configuration where a doping region is formed between the trench portions 40 after the trench portions 40 are formed is also included in a configuration where a trench portion 40 passes through a doping region.

The trench portions 40 includes the gate trench, the trench insulating film 42 and the trench conductive portion 44 provided on the upper surface 21. When a predetermined gate voltage is applied to the trench conductive portion 44, the trench portions 40 can form a channel, which is an inversion layer of electrons, on the boundary surface of the base region 14 which is in contact with the trench portion 40.

The trench insulating film 42 covers the inner wall of the gate trench. The trench insulating film 42 may be formed by oxidizing or nitriding the semiconductor of the inner wall of the gate trench.

In the gate trench, the trench conductive portion 44 is provided inside the trench insulating film 42. The trench insulating film 42 insulates the trench conductive portion 44 from the semiconductor substrate 10. The trench conductive portion 44 is formed of a conductive material such as polysilicon. The trench portion 40 is covered with the interlayer dielectric film 38 on the upper surface 21.

The interlayer dielectric film 38 is provided above the upper surface of the semiconductor substrate 10. Above the interlayer dielectric film 38, the emitter electrode 52 is provided. The interlayer dielectric film 38 is provided with one or more contact holes 54 which electrically connect the emitter electrode 52 to the semiconductor substrate 10.

The contact hole 54 is provided above each region of the emitter region 12 and the contact region 15. The contact hole 54 of the present example extends in the X-axis direction.

The channel mesa portion 91 and the non-channel mesa portion 92 are mesa portions which are adjacent to the trench portions 40 in the Y-axis direction. The mesa portion may be a portion of the semiconductor substrate 10 sandwiched by two trench portions 40 that are next to each other, and may be a portion from the upper surface 21 of the semiconductor substrate 10 down to the depth of the bottom portion, which is the deepest portion, of each trench portion 40.

The channel mesa portion 91 is a mesa portion provided with the emitter region 12 on the upper surface 21 of the semiconductor substrate 10. In the channel mesa portion 91, the emitter region 12 is provided adjacent to the trench portions 40 on the upper surface 21 of the semiconductor substrate 10. In the channel mesa portion 91, the contact region 15 is provided between the emitter regions 12 adjacent to each other in the Y-axis direction. That is, the emitter region 12 and the contact region 15 of the present example are alternately provided in the Y-axis direction. The emitter region 12 and the contact region 15 may be alternately provided in the X-axis direction.

The non-channel mesa portion 92 is a mesa portion in which the emitter region 12 is not provided on the upper surface 21 of the semiconductor substrate 10. For example, the non-channel mesa portion 92 includes a region of the second-conductivity-type such as the base region 14 and the contact region 15 on the upper surface 21 of the semiconductor substrate 10. The non-channel mesa portion 92 is electrically connected to the emitter electrode 52. That is, the non-channel mesa portion 92 is a non-floating mesa portion. The electrical connection between the non-channel mesa portion 92 and the emitter electrode 52 improves the gate controllability of the semiconductor device 100.

The base region 14 is a region of the second-conductivity-type provided above the drift region 18 of the semiconductor substrate 10 on the side of the upper surface 21. The base region 14 is, for example, of the P− type. The base region 14 may be provided in both the channel mesa portion 91 and the non-channel mesa portion 92. The base region 14 may be provided in contact with the trench portions 40. For example, the base region 14 has a doping concentration of $1E13$ $cm^{-3}$ to $1E14$ $cm^{-3}$. For example, $1E13$ $cm^{-3}$ means $1·10^{13}$ $cm^{-3}$.

The emitter region 12 is a region of the first-conductivity-type which has a higher doping concentration than the drift region 18. The emitter region 12 is, for example, of the N+ type. For example, the dopant of the emitter region 12 is arsenic (As). The emitter region 12 is provided on the upper surface of the channel mesa portion 91 and above the base region 14. The emitter region 12 is provided between the base region 14 and the upper surface 21 of the semiconductor substrate 10. The emitter region 12 is provided in contact with the trench portions 40. The emitter region 12 of the present example extends in the X-axis direction on the upper surface 21 of the semiconductor substrate 10. The emitter region 12 may be provided in the Y-axis direction between the two trench portions 40 which extend in the X-axis direction with the channel mesa portion 91 sandwiched therebetween. For example, the depth of the emitter region 12 is 0.1 μm to 0.2 μm.

The contact region 15 is a region of the second-conductivity-type having a higher doping concentration than the base region 14. The contact region 15 of the present example is, for example, of the P+ type. The contact region 15 is provided on the upper surface 21 of the semiconductor substrate 10. The contact region 15 of the present example is provided in both the channel mesa portion 91 and the non-channel mesa portion 92. The contact region 15 of the channel mesa portion 91 is provided in contact with the emitter region 12. The contact region 15 may be or may not be in contact with the trench portions 40. The contact region 15 of the present example is provided apart from the trench portions 40. The contact region 15 is also provided below the contact hole 54. For example, the contact region 15 has a doping concentration of $1E19$ $cm^{-3}$ to $1E20$ $cm^{-3}$.

The drift region 18 is a region of the first-conductivity-type provided in the semiconductor substrate 10. The drift region 18 of the present example is, for example, of the N− type. The drift region 18 may be a remained region in which another doping region is not formed in the semiconductor substrate 10. That is, the doping concentration in the drift region 18 may be a doping concentration in the semiconductor substrate 10.

The buffer region 20 is a region of the first-conductivity-type provided below the drift region 18. The buffer region 20 of the present example is, for example, of the N+ type. A doping concentration in the buffer region 20 is higher than a doping concentration in the drift region 18. The buffer region 20 may serve as a field stop layer which prevents a depletion layer spreading from the lower surface side of the base region 14 from reaching the collector region 22 of the second-conductivity-type and the cathode region of the first-conductivity-type.

The collector region 22 is a region of the second-conductivity-type provided in the lower surface side of the semiconductor substrate 10 in the transistor portion 70. The collector region 22 is, for example, of the P+ type. The collector region 22 of the present example is provided below the buffer region 20.

The collector electrode 24 is formed on a lower surface 23 of the semiconductor substrate 10. The collector electrode 24 is formed of a conductive material such as metal.

The accumulation region 16 is a region of the first-conductivity-type having a higher doping concentration than the drift region 18. The accumulation region 16 of the present example is, for example, of the N+ type. The accumulation region 16 is provided between the base region 14 and the drift region 18 in the non-channel mesa portion 92. The accumulation region 16 is provided above the second-conductivity-type region 19 and below the base region 14. The accumulation region 16 is provided in contact with the trench portions 40. By providing the accumulation region 16, the carrier injection enhancement effect (IE effect) can be increased, and an ON voltage of the transistor portion 70 can be reduced. The accumulation region 16 may be provided at both the channel mesa portion 91 and the non-channel mesa portion 92. Since the accumulation region 16 is also provided in the channel mesa portion 91, the ON voltage can be set in a less limited manner.

The first-conductivity-type region 17 is a region of the first-conductivity-type provided above the drift region 18. The first-conductivity-type region 17 is, for example, of the N− type. The first-conductivity-type region 17 is provided between the base region 14 and the second-conductivity-type region 19 in the non-channel mesa portion 92. For example, the first-conductivity-type region 17 is provided below the accumulation region 16. The doping concentration in the first-conductivity-type region 17 is lower than the accumulation region 16. For example, the first-conductivitytype region 17 has the same doping concentration as the drift region 18. In this case, the first-conductivity-type region 17 may be a region in which the accumulation region 16 and the second-conductivity-type region 19 are not provided and the drift region 18 remains. For example, the first-conductivity-type region 17 has a doping concentration of $1E13$ $cm^{-3}$ to $1E14$ $cm^{-3}$.

The second-conductivity-type region 19 is a region of the second-conductivity-type having a higher doping concentration than the base region 14. The second-conductivity-type region 19 is, for example, of the P+ type. The second-conductivity-type region 19 is provided in the mesa portion between the trench portions 40 adjacent to each other. The second-conductivity-type region 19 is provided between the base region 14 and the drift region 18 in the non-channel mesa portion 92. The second-conductivity-type region 19 of the present example is provided in contact with the trench portions 40. In the non-channel mesa portion 92, the second-conductivity-type region 19 facilitates the depletion during the off state, even if there is an accumulation region 16 with a high doping concentration. This improves the withstand voltage of the semiconductor device 100. Although the second-conductivity-type region 19 of the present example is provided below the accumulation region 16, it may also be provided above the accumulation region 16. The second-conductivity-type region 19 may also be provided in the channel mesa portion 91.

In the semiconductor device 100, the withstand voltage can be enhanced by providing the non-channel mesa portion 92 and reducing the number of the channel mesa portion 91. However, if a floating non-channel mesa portion 92 is provided, the controllability of the gate may be degraded. In the semiconductor device 100 of the present example, the electrical connection between the non-channel mesa portion 92 and the emitter electrode 52 can improve the gate controllability while enhancing the withstand voltage.

In one example, doping concentration in the accumulation region 16 and the second-conductivity-type region 19 is set in consideration of the balance between the ON voltage and the withstand voltage. The ON voltage of the semiconductor device 100 can be reduced by increasing the doping concentration in the accumulation region 16. However, when the doping concentration in the accumulation region 16 is increased, the withstand voltage of the semiconductor device 100 may decrease. In the semiconductor device 100 of the present example, the second-conductivity-type region 19 can maintain the withstand voltage even if the doping concentration in the accumulation region 16 is increased.

The doping concentration in the accumulation region 16 may be lower than the doping concentration in the second-conductivity-type region 19. In one example, the accumulation region 16 has a doping concentration of $5E17$ $cm^{-3}$ to $5E18$ $cm^{-3}$. The second-conductivity-type region 19 has a doping concentration of $5E16$ $cm^{-3}$ to $1E17$ $cm^{-3}$. The doping concentration in the accumulation region 16 and the second-conductivity-type region 19 may be appropriately set depending on the relationship between the ON voltage and the withstand voltage. Accordingly, in the semiconductor device 100, the withstand voltage can be enhanced, while the ON voltage is reduced by increasing the doping concentration in the accumulation region 16. The semiconductor device 100 can adjust the doping concentration in the accumulation region 16 and the second-conductivity-type region 19 to adjust the relationship between ON voltage and turn off loss Eoff without changing the doping concentration in the collector region 22.

Figure 2A:
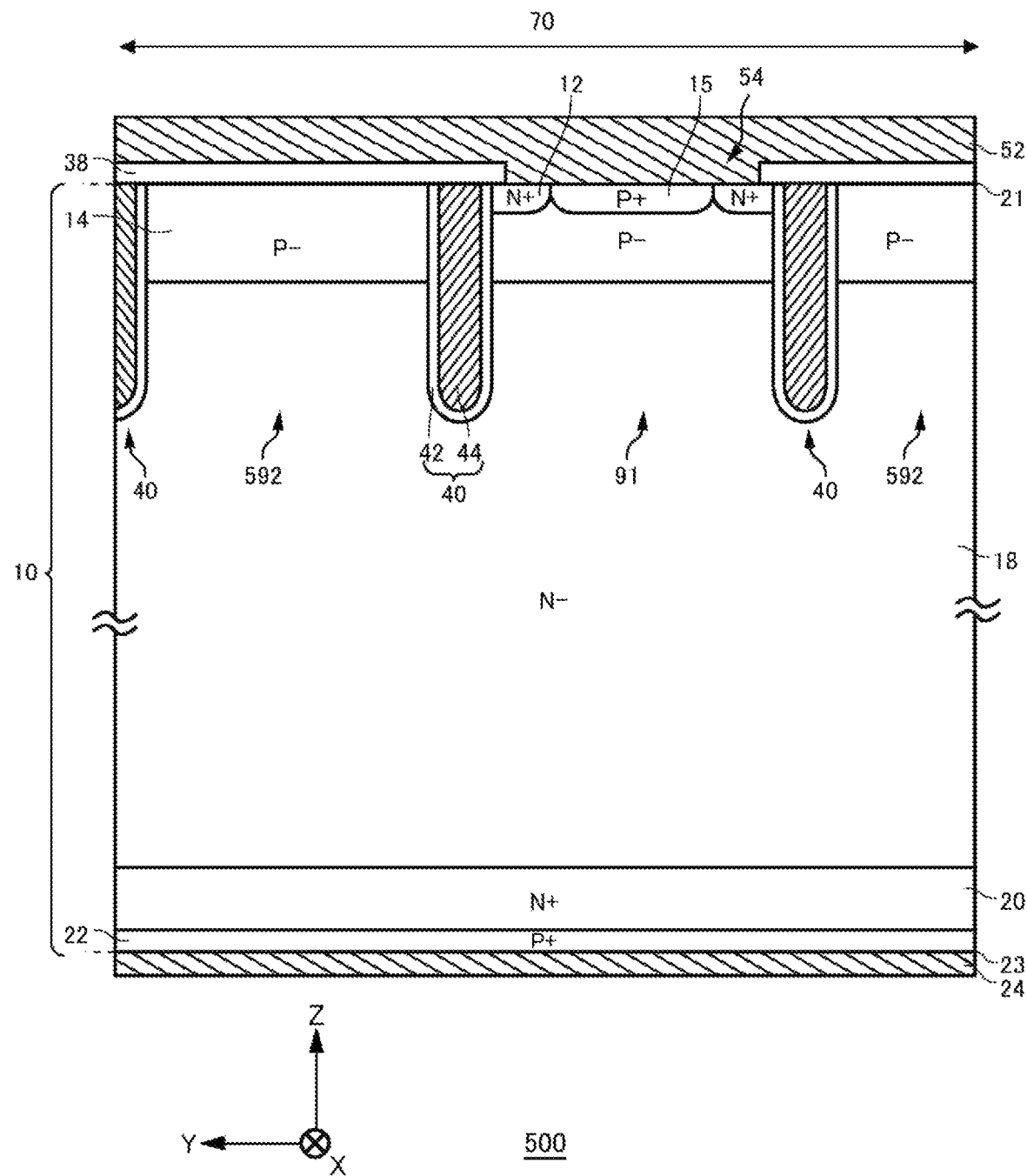
FIG. 2A shows one example of a configuration of the semiconductor device 500 according to a comparative example.

FIG. 2A shows one example of a configuration of the semiconductor device 500 according to the comparative example. The semiconductor device 500 is different from the semiconductor device 100 according to the example embodiment in that the floating mesa portion 592 does not include the first-conductivity-type region 17 and the second-conductivity-type region 19. The floating mesa portion 592 is different from the non-channel mesa portion 92 of the semiconductor device 100 in that the it is not electrically connected to the emitter electrode 52.

Since the semiconductor device 500 includes the floating mesa portion 592 which is not electrically connected to the emitter electrode 52, the controllability of the gate may be degraded as compared with the case in which the floating mesa portion 592 is not included. For example, in the semiconductor device 500 including the floating mesa portion 592, excess holes accumulate in the floating mesa portion 592 at turn-on, causing the increase in the potential of the floating mesa portion 592. When the potential of the floating mesa portion 592 increases, the displacement current may charge an input capacitor of the gate, causing the gate voltage to increase. The displacement current is expressed as $C \cdot dV/dt$, where $C$ is the feedback capacitance of the gate insulating film and $dV/dt$ is the temporal change in the collector voltage.

When the gate voltage increases, the switching speed increases, which is the current change rate $dI/dt$ of the collector current at turn-on. The switching speed is controlled by inserting a gate resistor in series with the gate metal layer, but, in the semiconductor device 500 including the floating mesa portion 592, there is a risk that the switching speed at turn-on cannot be reduced even if the gate resistance Rg is increased.

Figure 2B:
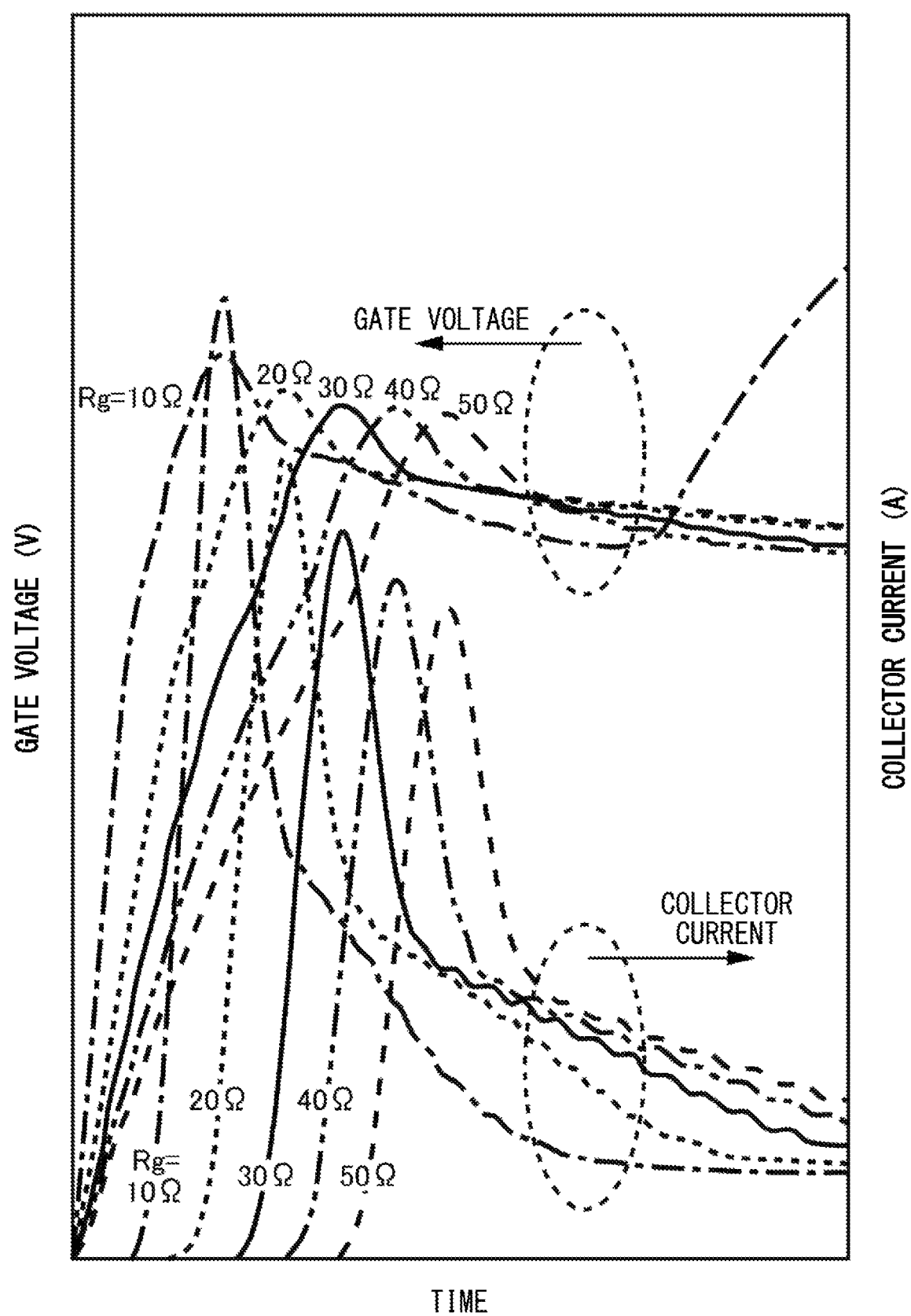
FIG. 2B shows a turn-on characteristic of the semiconductor device 500.

FIG. 2B shows the turn-on characteristic of the semiconductor device 500. The figure shows the dependence of the temporal change at turn-on of the gate voltage (V) and the collector current (A) when the gate resistance Rg is changed. The present example shows a turn-off characteristic in the case that the gate resistance Rg is changed from 10 ohm to 50 ohm by 10 ohm. In the semiconductor device 500, the current change rate $dI/dt$ of the collector current is not small enough, even if the gate resistance Rg is increased. Therefore, the gate controllability of the semiconductor device 500 is poor and a surge voltage occurs in the collector current.

Figure 3:
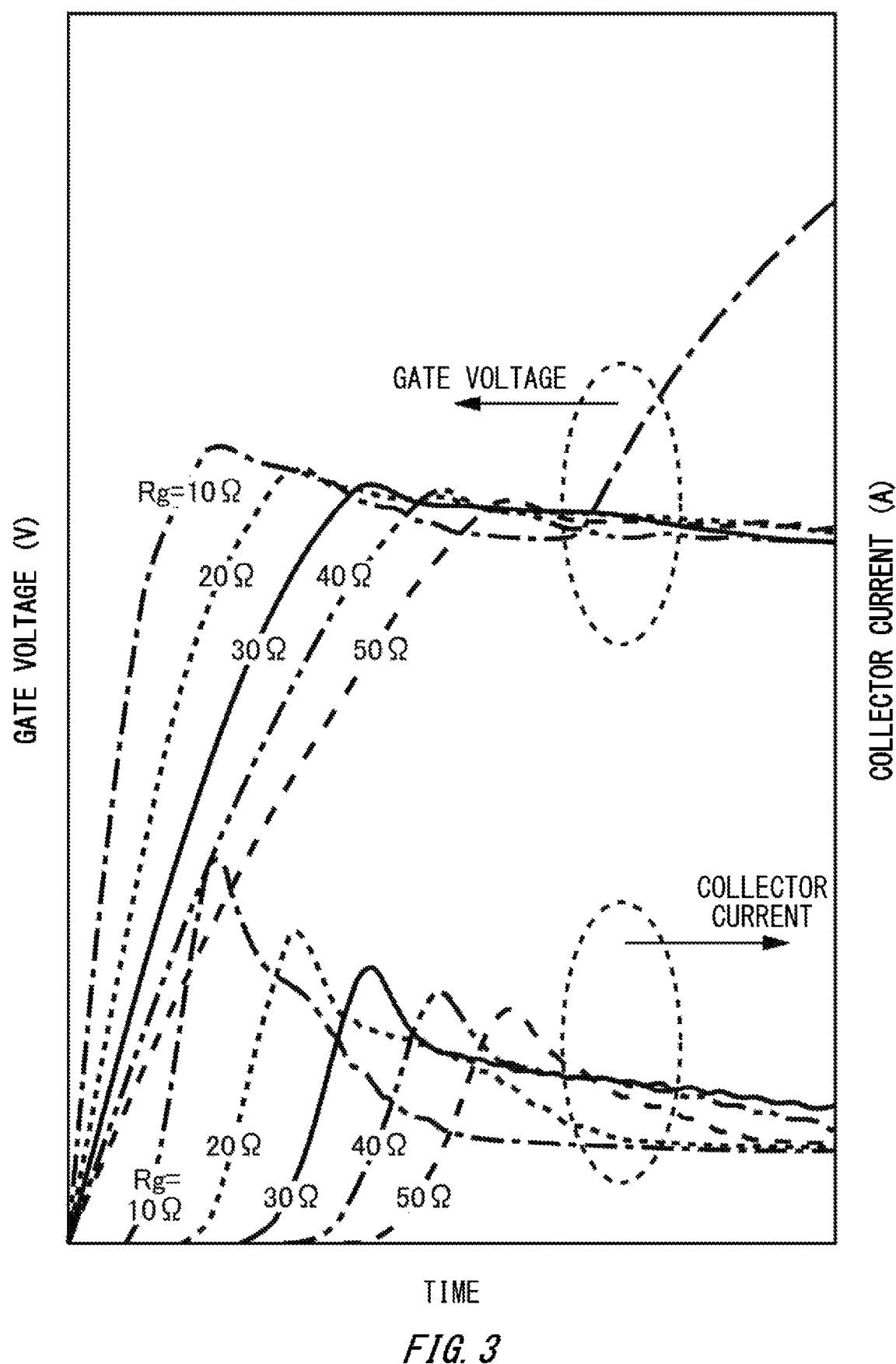
FIG. 3 shows a turn-on characteristic of the semiconductor device 100.

FIG. 3 shows a turn-on characteristic of the semiconductor device 100. The figure shows the dependence of the temporal change at turn-on of the gate voltage (V) and the collector current (A) in the case that the gate resistance Rg is changed. The present example shows a turn-off characteristic in the case that the gate resistance Rg is changed from 10 ohm to 50 ohm by 10 ohm. In the semiconductor device 100, the current change rate $dI/dt$ of the collector current decreases as the gate resistance Rg increases. Therefore, in the semiconductor device 100, the gate controllability is good and the surge voltage is inhibited.

Figure 4A:
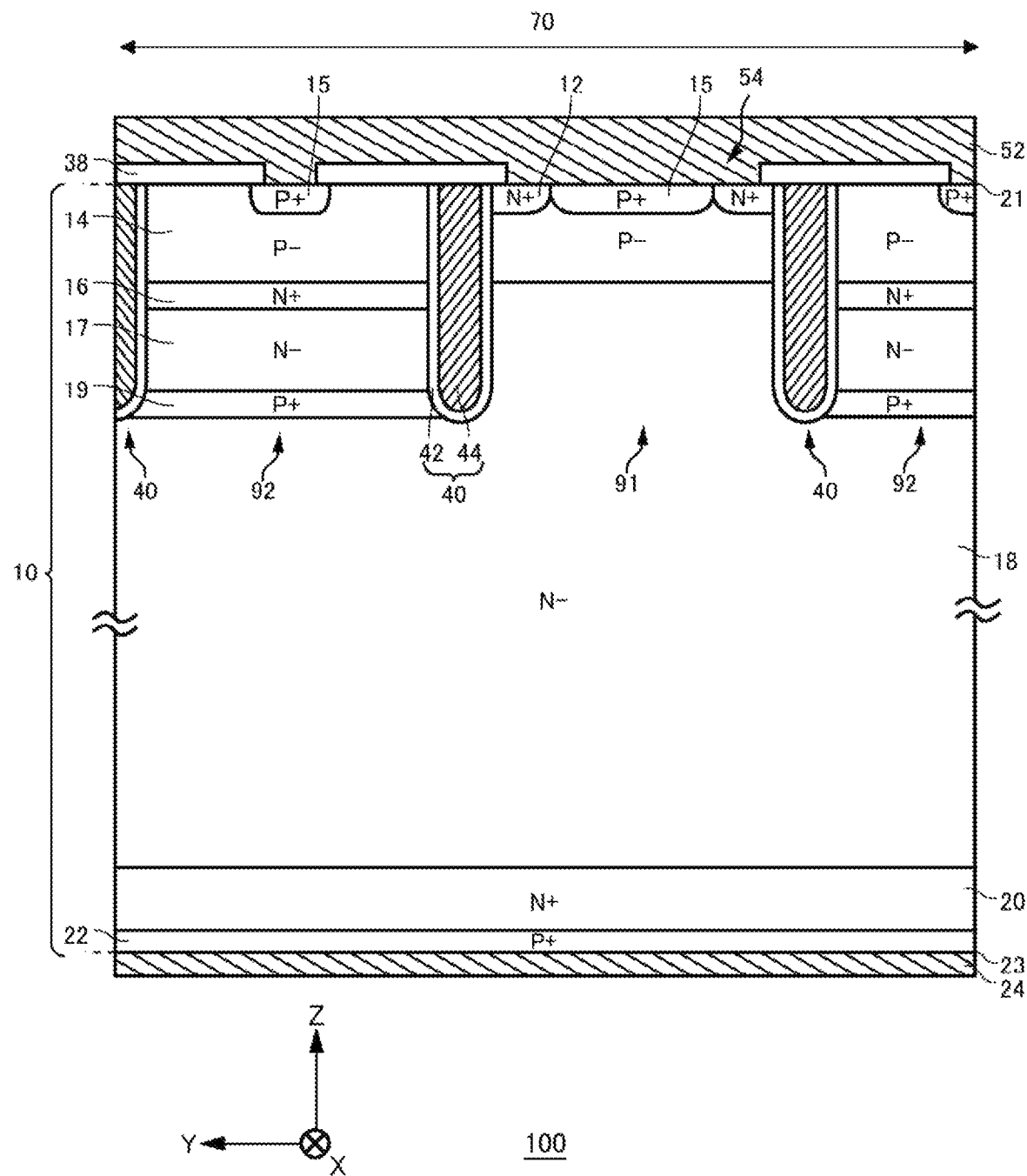
FIG. 4A shows an example embodiment in which the accumulation region 16 is shallow.
Figure 4B:
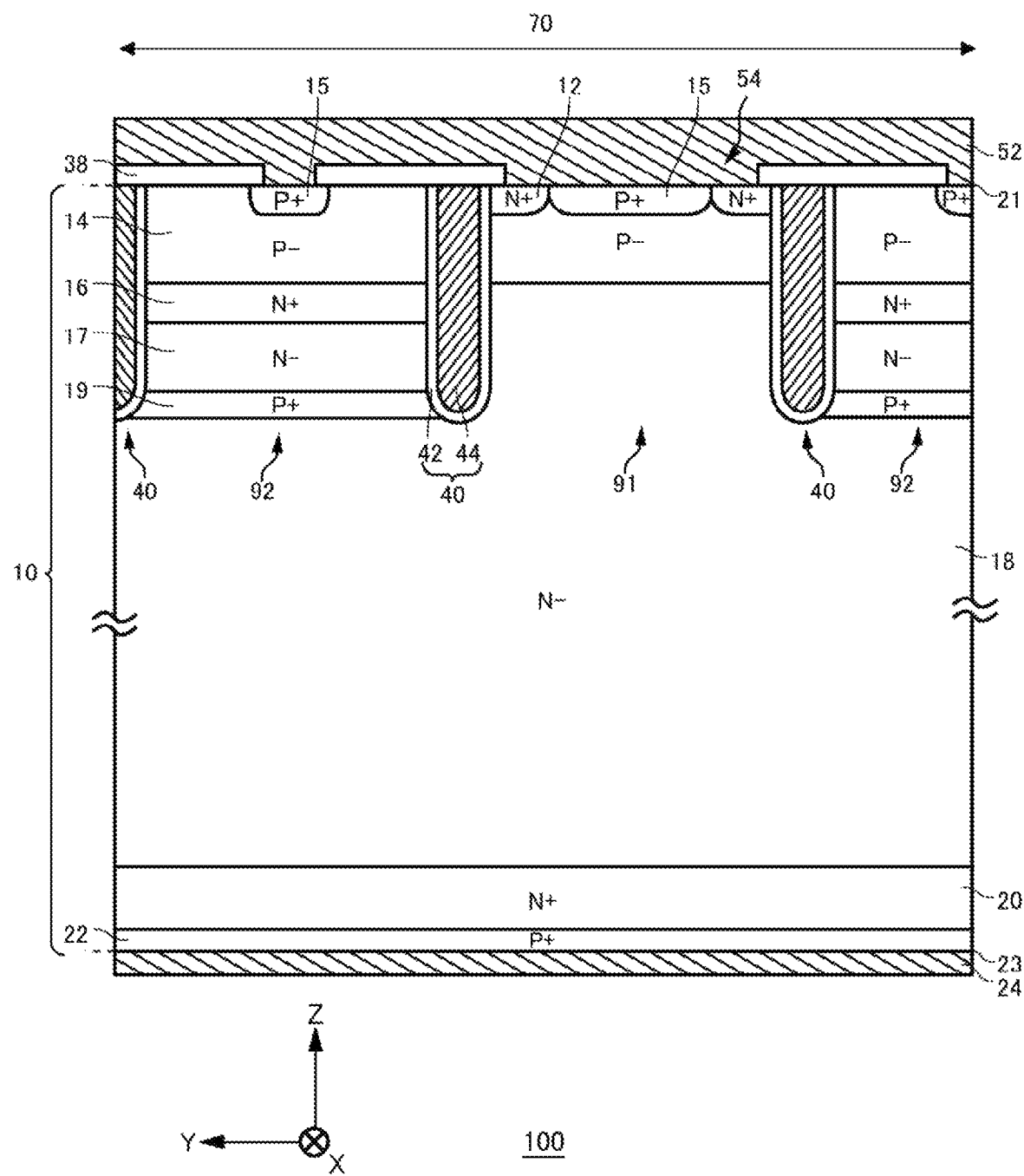
FIG. 4B shows an example embodiment in which the accumulation region 16 is deeper than in FIG. 4A.
Figure 4C:
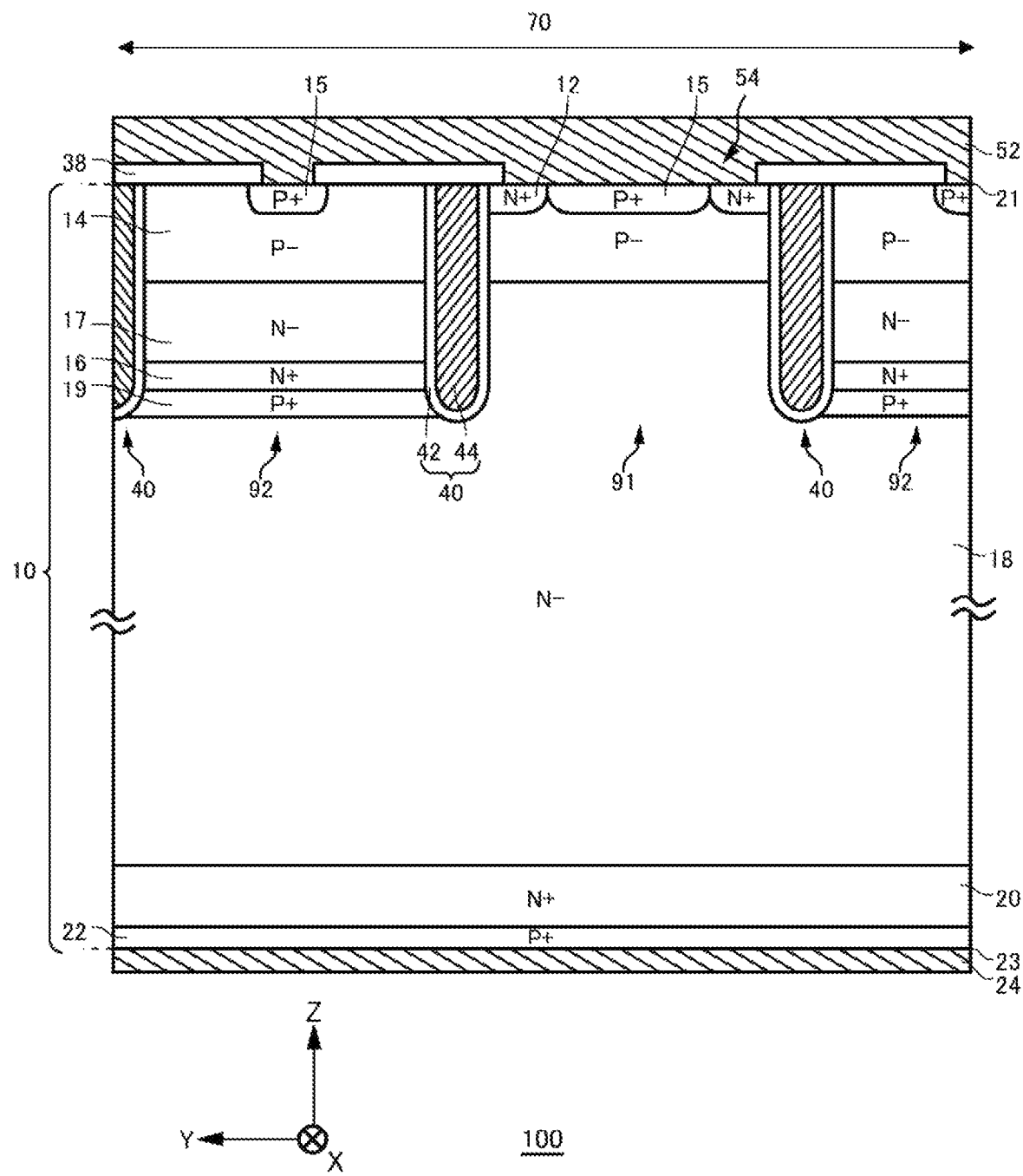
FIG. 4C shows an example embodiment in which the accumulation region 16 is deeper than in FIG. 4A and FIG. 4B.

FIG. 4A-FIG. 4C show one example of a configuration of the semiconductor device 100 according to the example embodiment. In FIG. 4A-FIG. 4C, the depth of the accumulation region 16 is changed, while the depth of the second-conductivity-type region 19 is fixed. In FIG. 4A-FIG. 4C, the depth of the accumulation region 16 is gradually increased.

FIG. 4A is an example embodiment in which the accumulation region 16 is shallow. The upper end of the accumulation region 16 of the present example is in contact with the lower end of the base region 14. The lower end of the accumulation region 16 is separated from the second-conductivity-type region 19. That is, the first-conductivity-type region 17 is provided between the accumulation region 16 and the second-conductivity-type region 19. For example, the depth of the lower end of the accumulation region 16 is 2.6 µm.

FIG. 4B is an example embodiment in which the accumulation region 16 is deeper than in FIG. 4A. The upper end of the accumulation region 16 of the present example is in contact with the lower end of the base region 14. However, the lower end of the accumulation region 16 is deeper than the lower end of the accumulation region 16 in FIG. 4A. The lower end of the accumulation region 16 is separated from the second-conductivity-type region 19. That is, the first-conductivity-type region 17 is provided between the accumulation region 16 and the second-conductivity-type region 19. For example, the depth of the lower end of the accumulation region 16 is 3.0 µm.

FIG. 4C shows an example embodiment in which the accumulation region 16 is deeper than in FIG. 4A and FIG. 4B. The upper end of the accumulation region 16 of the present example is separated from the lower end of the base region 14. That is, the first-conductivity-type region 17 is provided between the accumulation region 16 and the base region 14. The first-conductivity-type region 17 of the present example is provided above the accumulation region 16. The second-conductivity-type region 19 is in contact with the accumulation region 16. The lower end of the accumulation region 16 is in contact with the second-conductivity-type region 19. For example, the depth of the lower end of the accumulation region 16 is 4.0 µm.

Figure 4D:
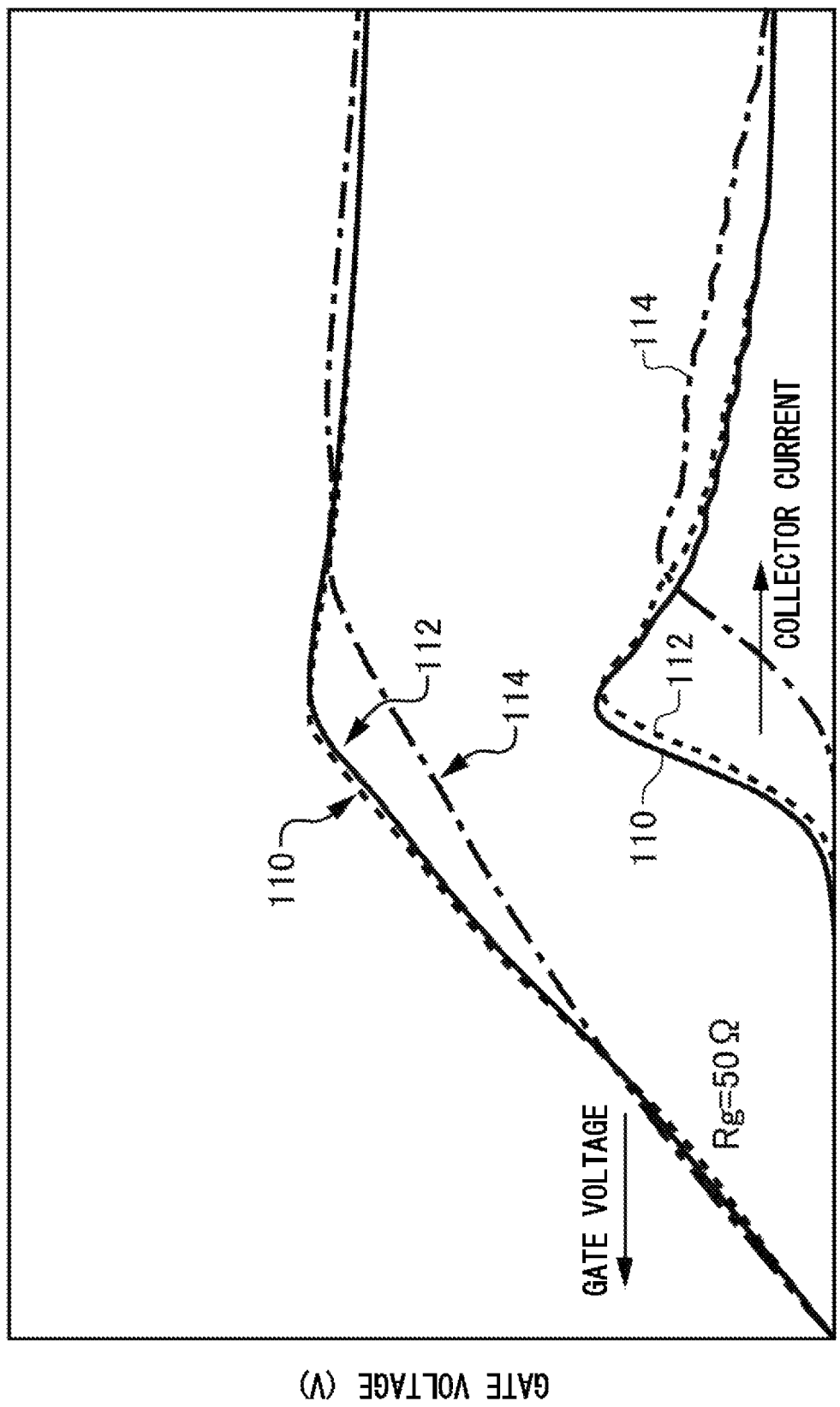
FIG. 4D shows a turn-on characteristic of the semiconductor device 100 according to FIG. 4A-FIG. 4C.

FIG. 4D shows a turn-on characteristic of the semiconductor device 100 according to FIG. 4A-FIG. 4C. The curve 110, the curve 112, and the curve 114 show the turn-on characteristic of the semiconductor device 100 according to FIG. 4A-FIG. 4C, respectively. In the curve 114, in particular, the gate controllability of the semiconductor device 100 can be improved, and the surge voltage can be inhibited. The result shows that, in the semiconductor device 100, the controllability of the switching speed can be improved as the depth of the accumulation region 16 increases and the interval between the accumulation region 16 and the second-conductivity-type region 19 is narrowed.

Figure 5A:
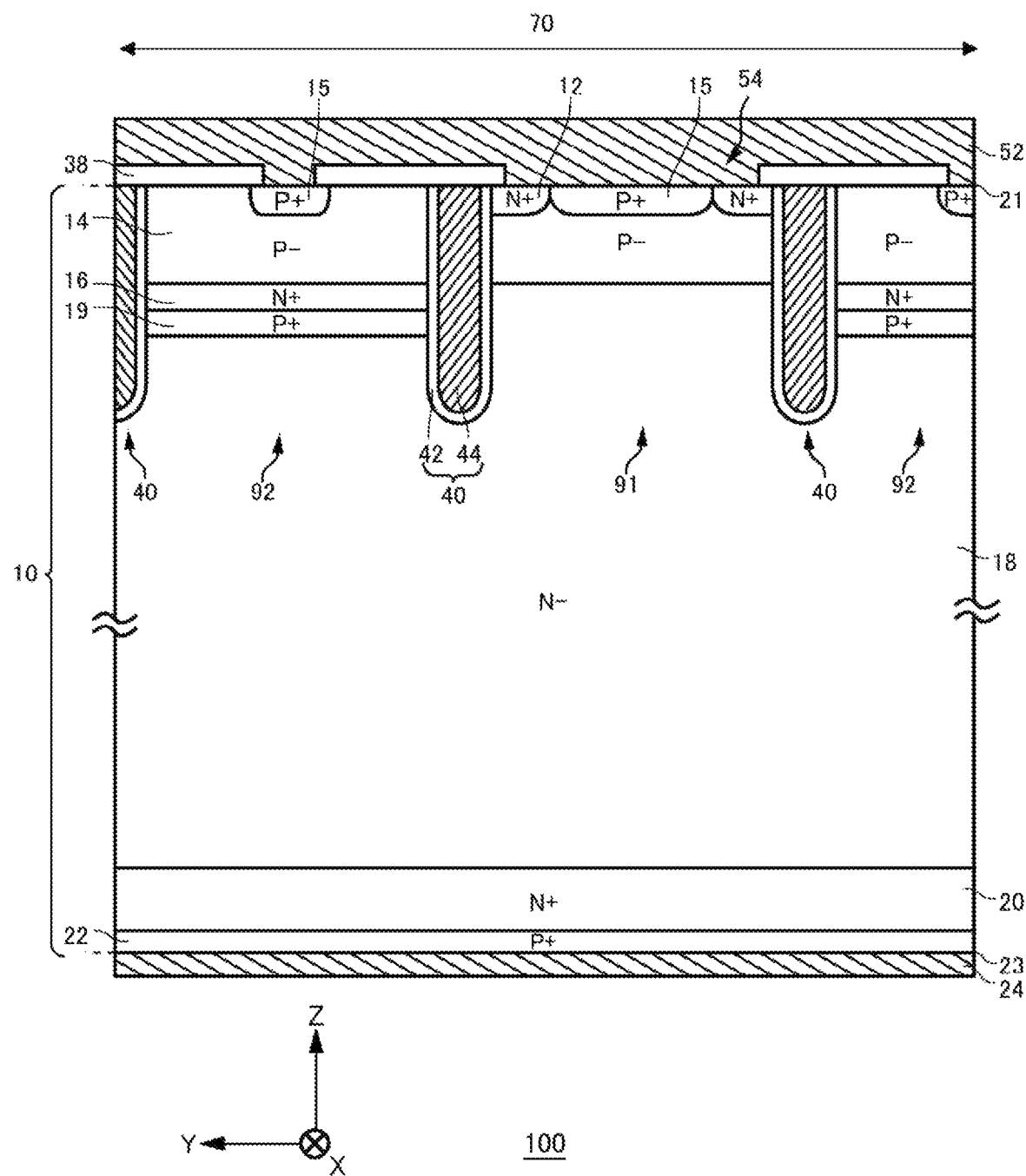
FIG. 5A shows an example embodiment in which the second-conductivity-type region 19 is shallow.
Figure 5B:
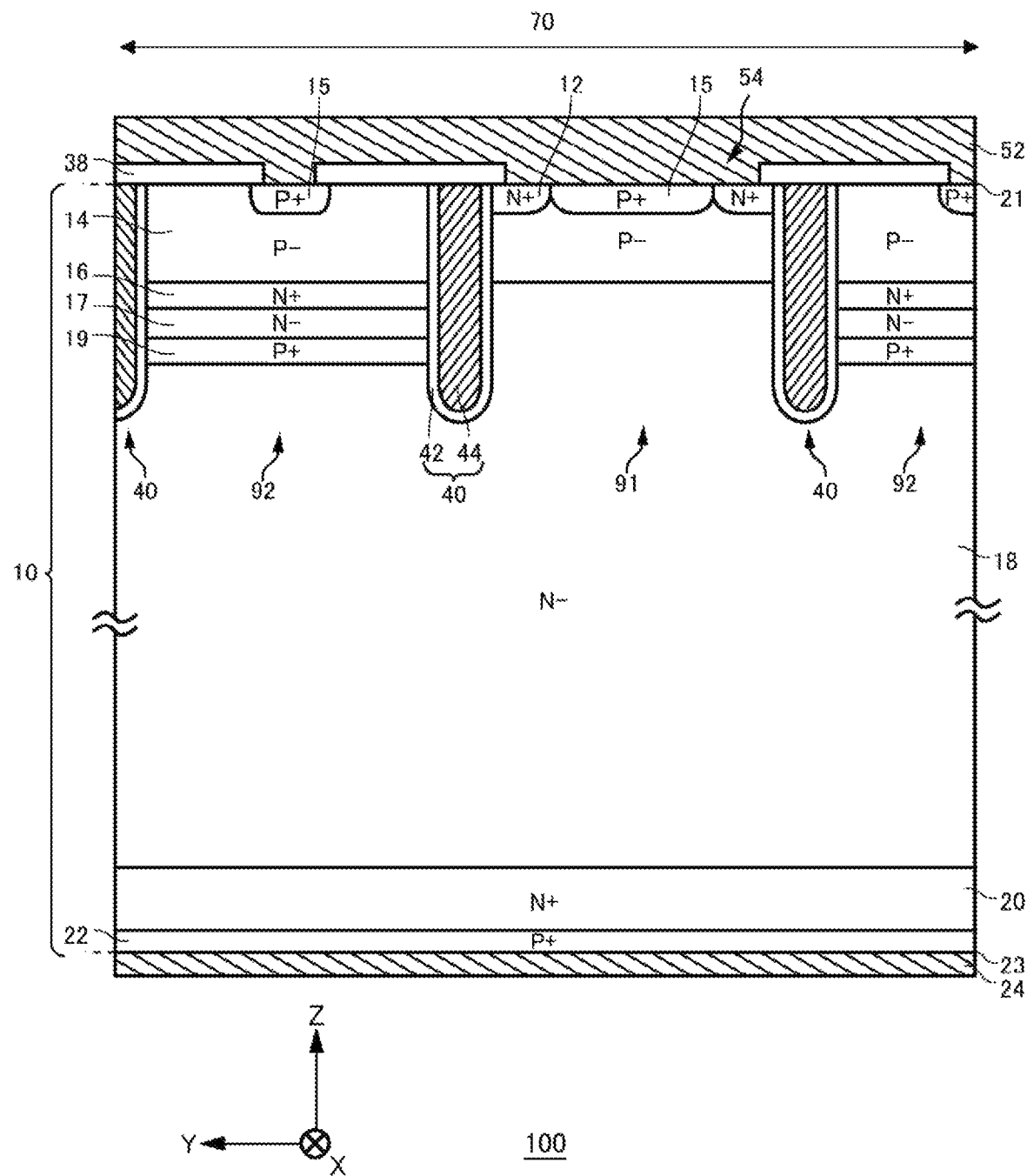
FIG. 5B shows an example embodiment in which the second-conductivity-type region 19 is deeper than in FIG. 5A.
Figure 5C:
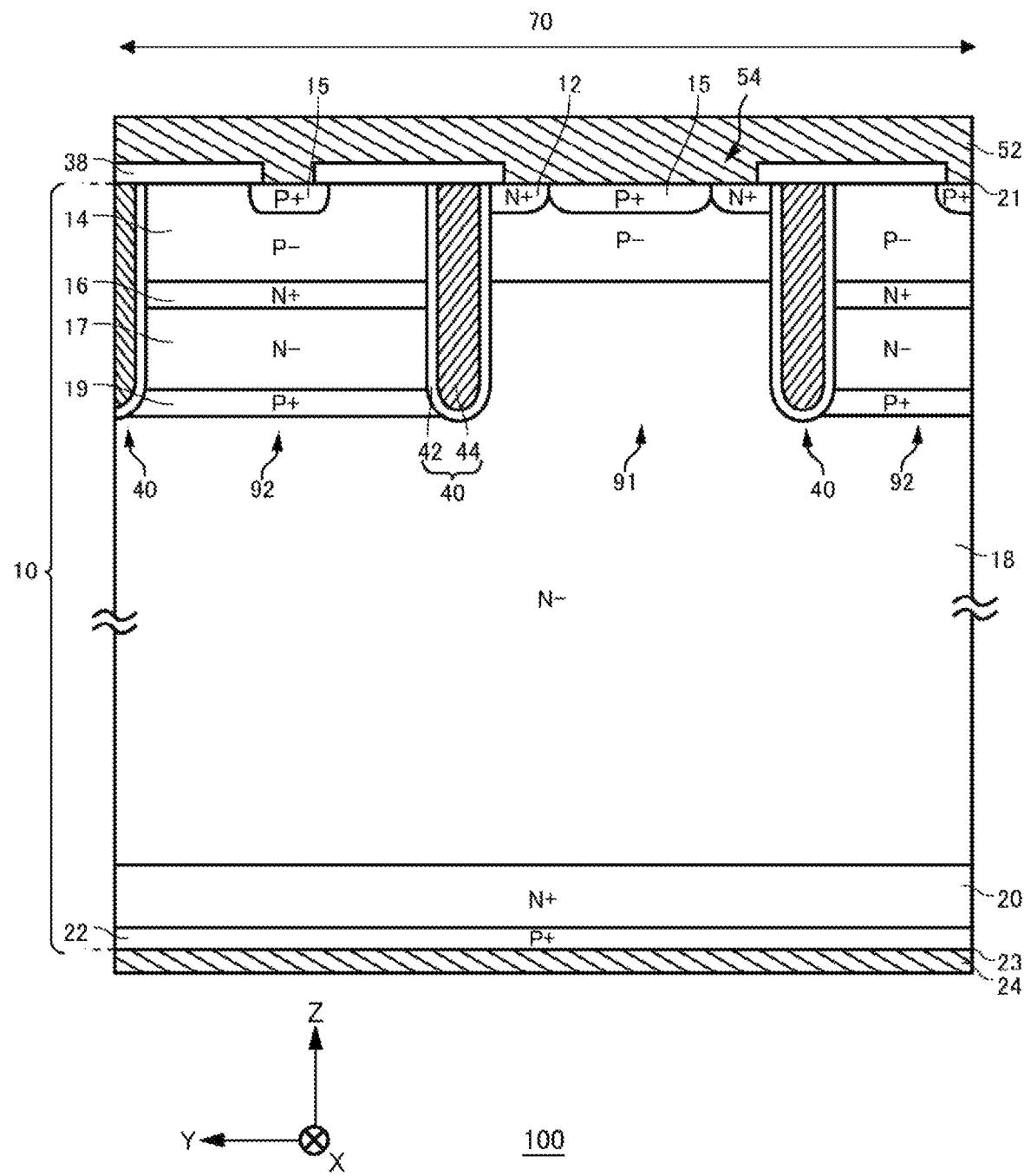
FIG. 5C shows an example embodiment in which the second-conductivity-type region 19 is deeper than in FIG. 5A and FIG. 5B.

FIG. 5A-FIG. 5C shows one example of a configuration of the semiconductor device 100 according to an example embodiment. In FIG. 5A-FIG. 5C, the depth of the second-conductivity-type region 19 is changed while the depth of the accumulation region 16 is fixed. In FIG. 5A-FIG. 5C, the depth of the second-conductivity-type region 19 is gradually increased.

FIG. 5A is an example embodiment in which the second-conductivity-type region 19 is shallow. The upper end of the second-conductivity-type region 19 of the present example is in contact with the lower end of the accumulation region 16. The lower end of the second-conductivity-type region 19 is provided above the lower end of the trench portions 40. For example, the depth of the lower end of the second-conductivity-type region 19 is 3.0 µm.

FIG. 5B shows an example embodiment in which the second-conductivity-type region 19 is deeper than in FIG. 5A. The upper end of the second-conductivity-type region 19 of the present example is separated from the lower end of the accumulation region 16. That is, the first-conductivity-type region 17 is provided between the accumulation region 16 and the second-conductivity-type region 19. The lower end of the second-conductivity-type region 19 is provided above the lower end of the trench portions 40. For example, the depth of the lower end of the second-conductivity-type region 19 is 4.0 µm.

FIG. 5C shows an example embodiment in which the second-conductivity-type region 19 is deeper than in FIG. 5A and FIG. 5B. The upper end of the second-conductivity-type region 19 of the present example is separated from the lower end of the accumulation region 16. That is, the first-conductivity-type region 17 is provided between the accumulation region 16 and the second-conductivity-type region 19. The lower end of the second-conductivity-type region 19 is provided below the lower end of the trench portions 40. For example, the depth of the lower end of the second-conductivity-type region 19 is 4.5 µm.

Figure 5D:
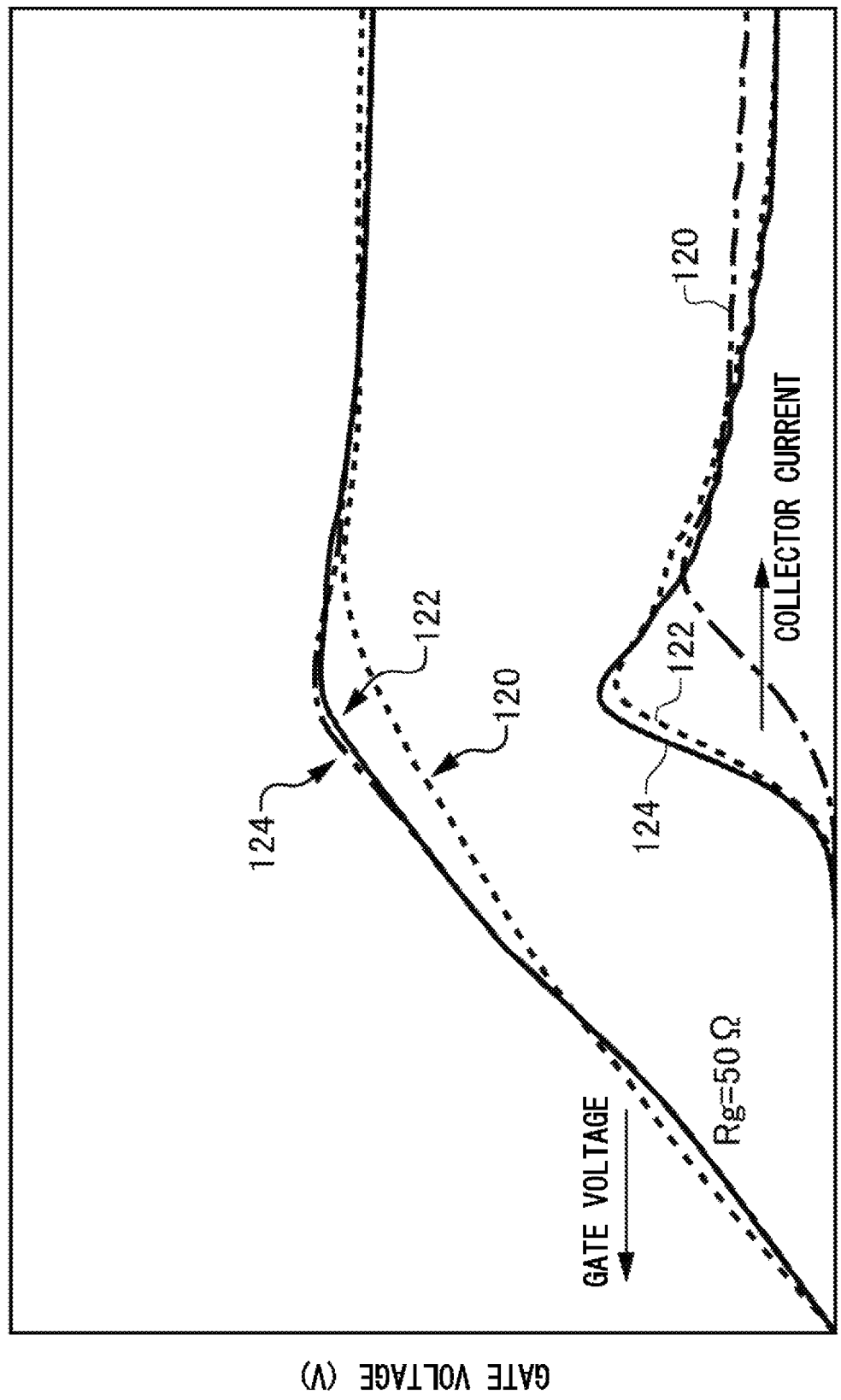
FIG. 5D shows a turn-on characteristic of the semiconductor device 100 according to FIG. 5A-FIG. 5C.

FIG. 5D shows a turn-on characteristic of the semiconductor device 100 according to FIG. 5A-FIG. 5C. The curve 120, the curve 122, and the curve 124 show the turn-on characteristic of the semiconductor device 100 according to FIG. 5A-FIG. 5C, respectively. In the curve 120, in particular, the gate controllability of the semiconductor device 100 can be improved, and the surge voltage can be inhibited. The result shows that, in the semiconductor device 100, the controllability of the switching speed can be improved as the depth of the accumulation region 16 decreases and the interval between the accumulation region 16 and the second-conductivity-type region 19 is narrowed.

The result of the turn-off characteristic in FIG. 4D and FIG. 5D shows that the accumulation region 16 is preferably provided in contact with the second-conductivity-type region 19. If the second-conductivity-type region 19 is not in contact with the lower end of the accumulation region 16, holes may accumulate below the accumulation region 16, causing displacement current. When displacement current occurs, the controllability of the gate is degraded. However, if the second-conductivity-type region 19 is provided in contact with and below the accumulation region 16, holes accumulate in the second-conductivity-type region 19. If holes accumulate in the second-conductivity-type region 19 with high doping concentration, the gate capacity is less likely to be affected and thus the displacement current is less likely to be generated. Therefore, the displacement current due to the accumulated holes can be inhibited by providing the second-conductivity-type region 19 in contact with and below the accumulation region 16.

Figure 6:
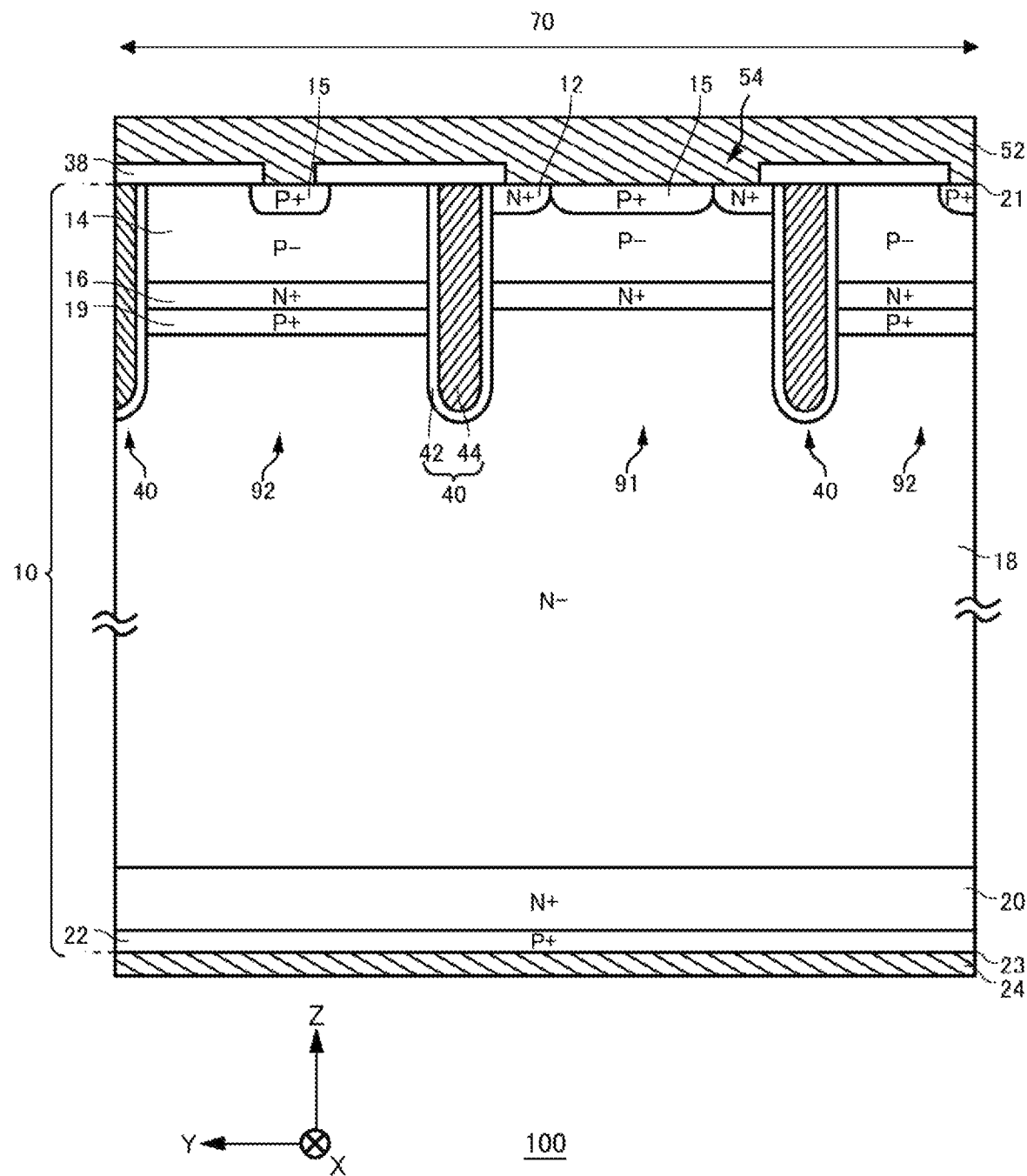
FIG. 6 shows one example of a configuration of the semiconductor device 100 according to an example embodiment.

FIG. 6 shows one example of a configuration of the semiconductor device 100 according to the example embodiment. The semiconductor device 100 of the present example is different from another example embodiment in that the accumulation region 16 is also included in the channel mesa portion 91. In the semiconductor device 100 of the present example, the ON voltage can be further reduced by providing the accumulation region 16 in both the channel mesa portion 91 and the non-channel mesa portion 92.

In the present example, the accumulation region 16 of the non-channel mesa portion 92 has the same depth as the accumulation region 16 of the channel mesa portion 91. The accumulation region 16 of the non-channel mesa portion 92 may have a depth different from the accumulation region 16 of the channel mesa portion 91. For example, the accumulation region 16 is provided in contact with the base region 14 in the channel mesa portion 91. On the other hand, in the non-channel mesa portion 92, the accumulation region 16 may be provided at a depth different from the accumulation region 16 of the channel mesa portion 91 as long as it is provided in contact with the second-conductivity-type region 19. In this manner, the relationship between ON voltage and withstand voltage can be optimally set by providing the accumulation region 16 in the channel mesa portion 91 and the non-channel mesa portion 92 on the different conditions.

Figure 7:
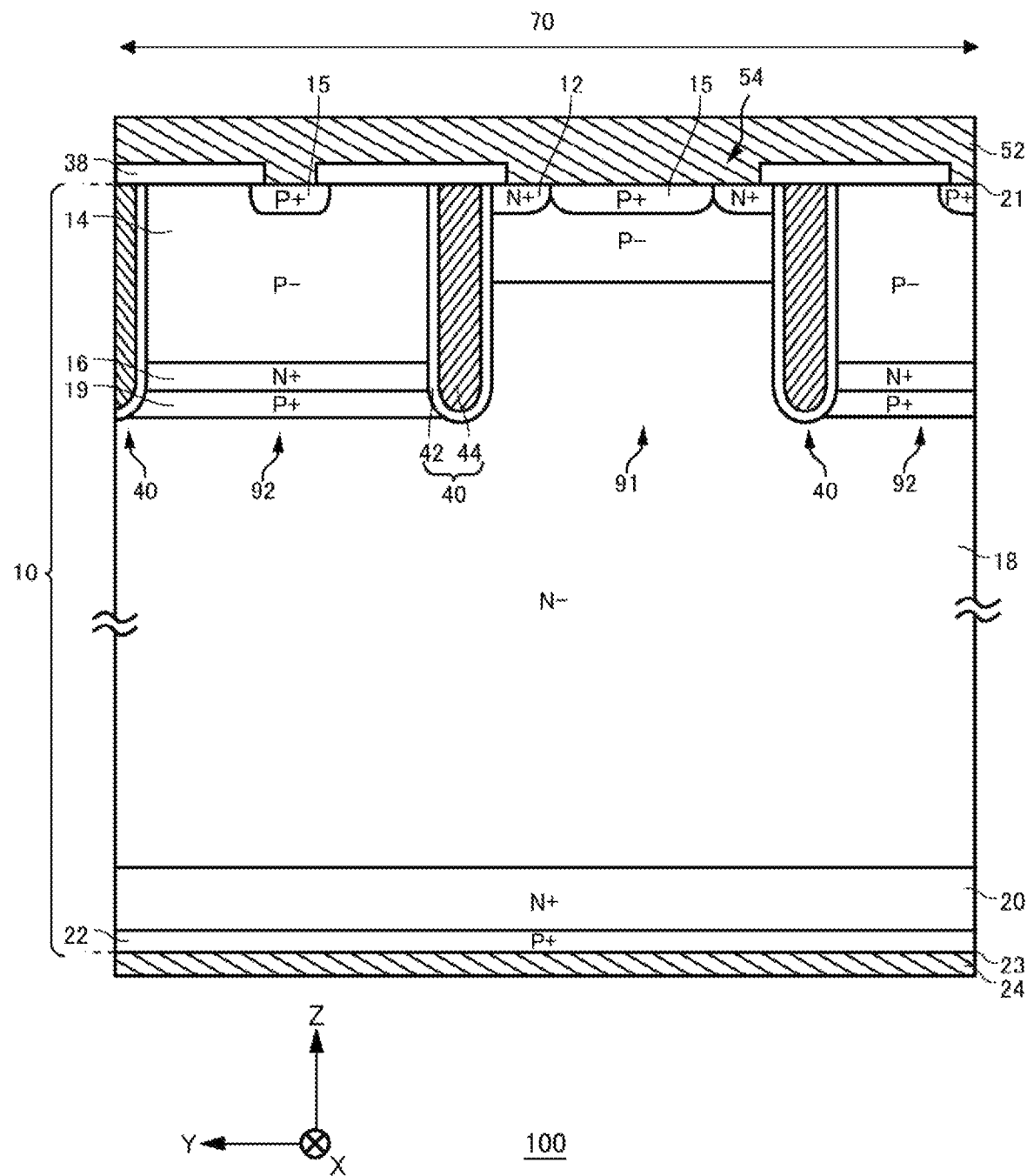
FIG. 7 shows one example of a configuration of the semiconductor device 100 according to an example embodiment.

FIG. 7 shows one example of a configuration of the semiconductor device 100 according to the example embodiment. The semiconductor device 100 of the present example is different from the semiconductor device 100 according to FIG. 4C in that the first-conductivity-type region 17 is not included in the non-channel mesa portion 92. That is, the base region 14 of the present example is in contact with the accumulation region 16 in the non-channel mesa portion 92. In the present example, the base region 14 of the channel mesa portion 91 and the base region 14 of the non-channel mesa portion 92 are provided at different depths. The base region 14 of the present example is deeper in the non-channel mesa portion 92 than in the channel mesa portion 91. Accordingly, the semiconductor device 100 can mitigate the electric field in the bottom of the trench portions 40 and increase the withstand voltage, even if a high collector-emitter voltage Vce is applied.

Figure 8:
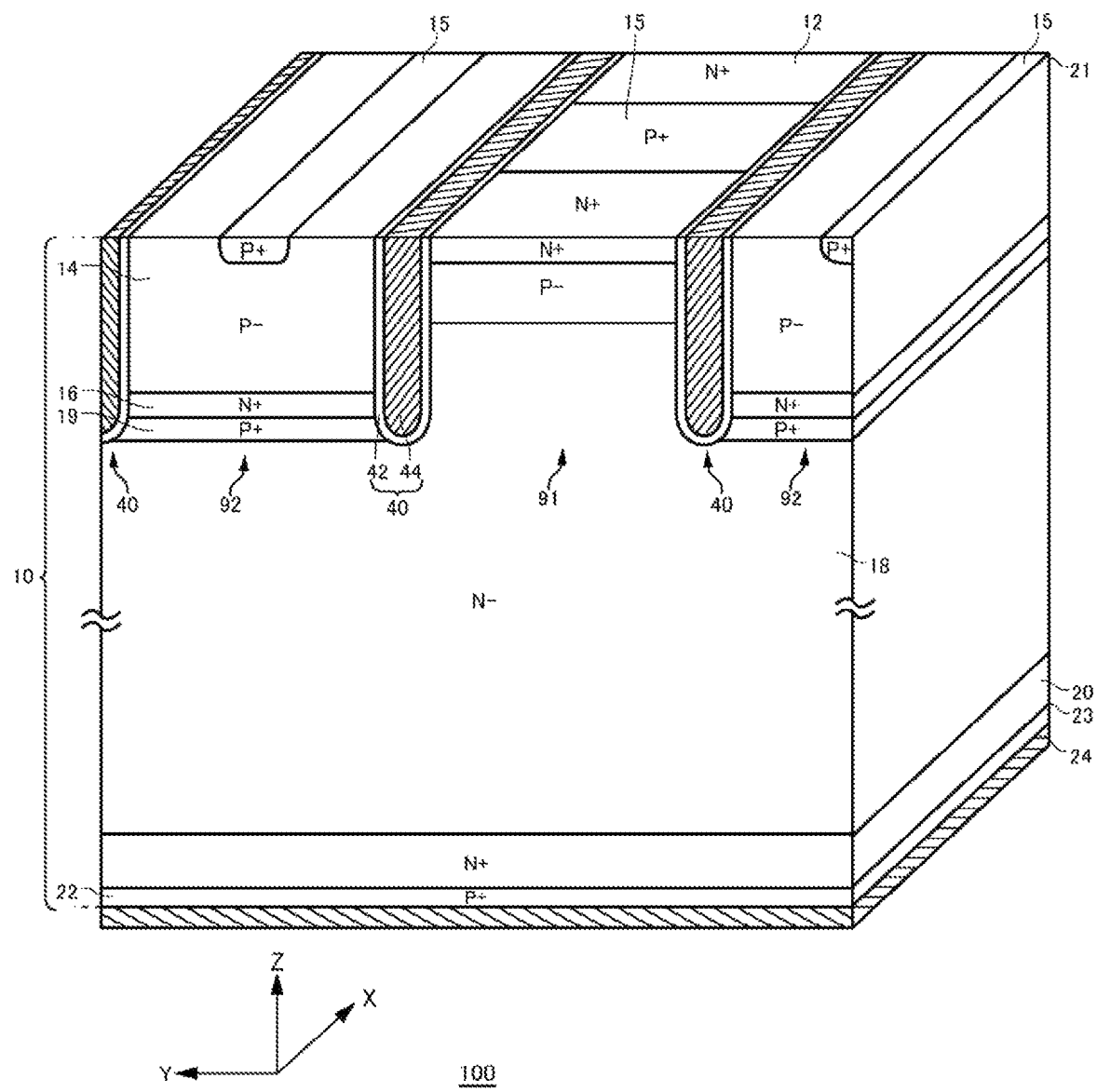
FIG. 8 shows one example of a configuration of the semiconductor device 100 according to an example embodiment.

FIG. 8 shows one example of a configuration of the semiconductor device 100 according to the example embodiment. In the semiconductor device 100 of the present example, the arrangement of the emitter region 12 and the contact region 15 in the channel mesa portion 91 is different from in FIG. 7. The emitter region 12 and the contact region 15 in the present example are arranged next to each other in an arrangement direction. That is, the emitter region 12 and the contact region 15 are alternately provided in the X-axis direction. Accordingly, the emitter region 12 and the contact region 15 are easy patterned even if the mesa width of the channel mesa portion 91 is narrowed. Therefore, the limitation of the patterning precision is less likely to occur, even if the mesa width of the channel mesa portion 91 is narrowed. In this manner, in the semiconductor device 100 of the present example, the ON voltage can be reduced by inhibiting the discharge of the carrier, since the problem of the patterning precision is less likely to occur even if the mesa width of the channel mesa portion 91 is narrowed. In the present example, the interlayer dielectric film 38 and the emitter electrode 52 are omitted to simplify the figure.

Figure 9:
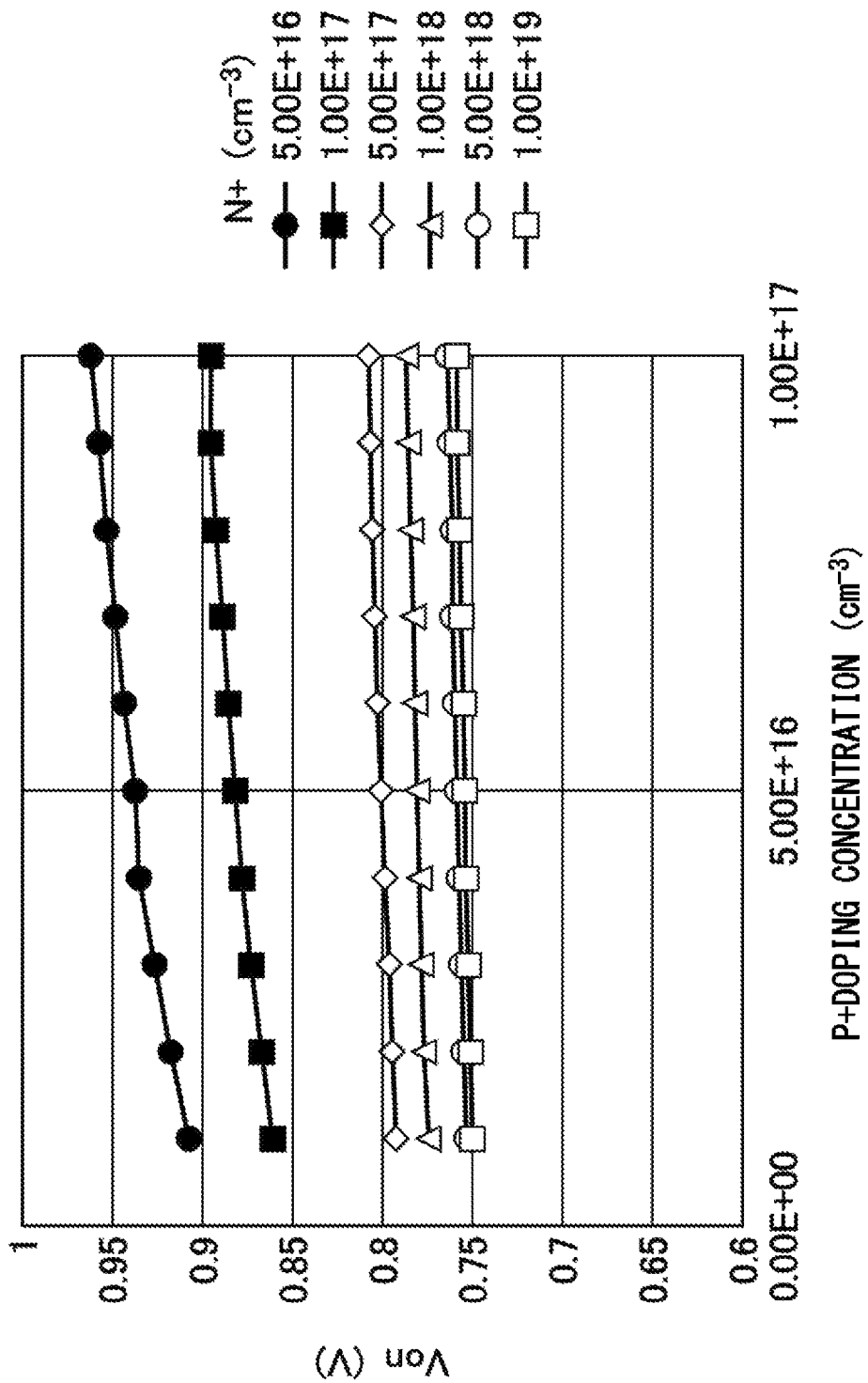
FIG. 9 shows a relationship between the ON voltage and the doping concentration in the non-channel mesa portion 92.

FIG. 9 shows a relationship between the ON voltage and the doping concentration in the non-channel mesa portion 92. The vertical axis indicates ON voltage Von (V) and the horizontal axis indicates the doping concentration ($cm^{-3}$) in the second-conductivity-type region 19. Each curve shows the relationship between the ON voltage and the doping concentration in the second-conductivity-type region 19 with various doping concentrations ($cm^{-3}$) of the accumulation region 16. As the doping concentration in the accumulation region 16 increases, the ON voltage decreases. On the other hand, as the doping concentration in the second-conductivity-type region 19 decreases, the ON voltage increases. However, if the doping concentration in the accumulation region 16 is high, the doping concentration in the second-conductivity-type region 19 is less likely to be affected.

Figure 10:
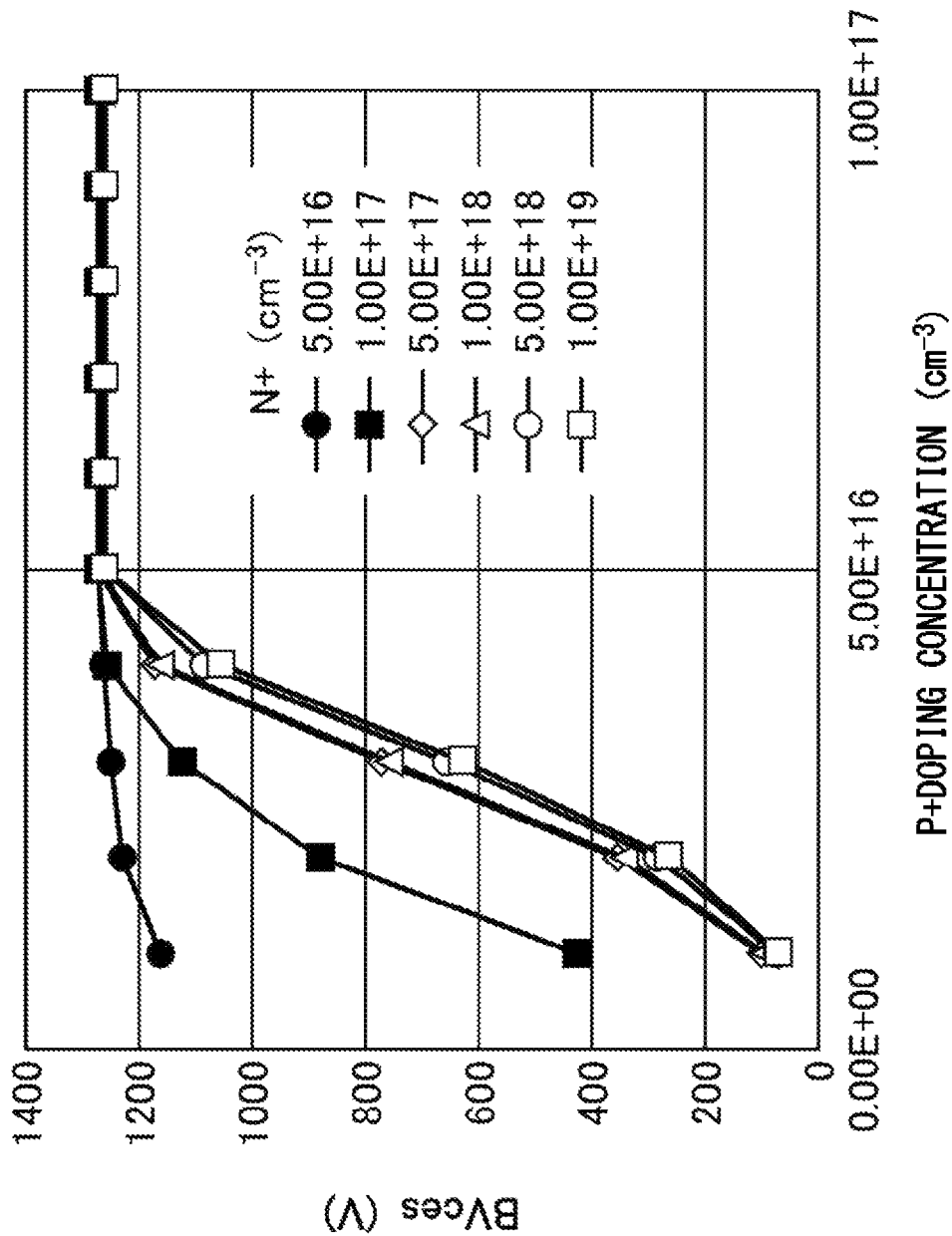
FIG. 10 shows a relationship between the withstand voltage and the doping concentration in the non-channel mesa portion 92.

FIG. 10 shows the relationship between the withstand voltage and the doping concentration in the non-channel mesa portion 92. The vertical axis indicates withstand voltage BVces (V) and the horizontal axis indicates the doping concentration in the second-conductivity-type region 19 ($cm^{-3}$). Each curve shows the relationship between the withstand voltage and the doping concentration in the second-conductivity-type region 19 with various doping concentrations ($cm^{-3}$) of the accumulation region 16. As the doping concentration in the accumulation region 16 increases, the ON voltage decreases. On the other hand, as the doping concentration in the second-conductivity-type region 19 decreases, the ON voltage increases. However, if the doping concentration in the accumulation region 16 is high, the doping concentration in the second-conductivity-type region 19 is less likely to be affected.

If the doping concentration in the second-conductivity-type region 19 is lower than $5E16\ cm^{-3}$, as doping concentration in the second-conductivity-type region 19 increases, the withstand voltage improves. On the other hand, if the doping concentration in the second-conductivity-type region 19 is higher than $5E16\ cm^{-3}$, the doping concentration in the second-conductivity-type region 19 is less likely to be affected and the withstand voltage is constant. The doping concentration in the second-conductivity-type region 19 with this constant withstand voltage does not depend on the doping concentration in the accumulation region 16. The reason is that the region determining the withstand voltage moves from the PN junction between the accumulation region 16 and the second-conductivity-type region 19 to a high electric field portion at the bottom of the trench portion 40.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES 10 semiconductor substrate, 12 emitter region, 14 base region, 15 contact region, 16 accumulation region, 17 first-conductivity-type region, 18 drift region, 19 second-conductivity-type region, 20 buffer region, 21 upper surface, 22 collector region, 23 lower surface, 24 collector electrode, 38 interlayer dielectric film, 40 trench portions, 42 trench insulating film, 44 trench conductive portion, 52 emitter electrode, 54 contact hole, 70 transistor portion, 91 channel mesa portion, 92 non-channel mesa portion, 100 semiconductor device, 110, 112, 114, 120, 122, 124 curve, 500 semiconductor device, 592 floating mesa portion

What is claimed is:
1. A semiconductor device comprising:
 a drift region of a first-conductivity-type provided in a semiconductor substrate;
 a base region of a second-conductivity-type provided above the drift region on an upper surface side in the semiconductor substrate;
 a plurality of trench portions arranged next to each other in a predetermined arrangement direction on an upper surface of the semiconductor substrate;

an emitter region of a first-conductivity-type which has a higher doping concentration than the drift region and is provided in a mesa portion between adjacent ones of the plurality of trench portions;

an accumulation region of a first-conductivity-type which has a higher doping concentration than the drift region and is provided in a mesa portion between adjacent ones of the plurality of trench portions; and a second-conductivity-type region of a second-conductivity-type which has a higher doping concentration than the base region and is provided in a mesa portion between adjacent ones of the plurality of trench portions;

wherein the accumulation region and the second-conductivity-type region are provided between the base region and the drift region in a non-channel mesa portion that does not have the emitter region provided therein and that is of mesa portions between adjacent ones of the plurality of trench portions, and the accumulation region is provided above the second-conductivity-type region and below the base region.

2. The semiconductor device according to claim 1, further comprising an emitter electrode provided above the semiconductor substrate, wherein the non-channel mesa portion is electrically connected to the emitter electrode.

3. The semiconductor device according to claim 1, further comprising a first-conductivity-type region of a first-conductivity-type which has a lower doping concentration than the accumulation region and is provided between the base region and the second-conductivity-type region in the non-channel mesa portion.

4. The semiconductor device according to claim 3, wherein the first-conductivity-type region has a same doping concentration as the drift region.

5. The semiconductor device according to claim 3, wherein the first-conductivity-type region is provided above the accumulation region.

6. The semiconductor device according to claim 3, wherein the first-conductivity-type region is provided below the accumulation region.

7. The semiconductor device according to claim 1, wherein the second-conductivity-type region is in contact with a lower end of the accumulation region.

8. The semiconductor device according to claim 1, comprising a channel mesa portion which is the mesa portion in which the emitter region is provided, wherein the accumulation region is provided in both the channel mesa portion and the non-channel mesa portion, and the accumulation region in the non-channel mesa portion has a same depth as the accumulation region in the channel mesa portion.

9. The semiconductor device according to claim 1, comprising a channel mesa portion which is the mesa portion in which the emitter region is provided, wherein the accumulation region is provided in both the channel mesa portion and the non-channel mesa portion, and the accumulation region in the non-channel mesa portion has a different depth from the accumulation region in the channel mesa portion.

10. The semiconductor device according to claim 8, wherein the base region in the non-channel mesa portion is deeper than the base region in the channel mesa portion.

11. The semiconductor device according to claim 8, further comprising a contact region which is provided in the channel mesa portion and is arranged next to each other in the arrangement direction with the emitter region.

12. The semiconductor device according to claim 1, wherein the second-conductivity-type region is in contact with the trench portions.

13. The semiconductor device according to claim 1, wherein a doping concentration in the second-conductivity-type region is higher than a doping concentration in the accumulation region in the non-channel mesa portion.

* * * * *